(12) United States Patent
Fonden et al.

(10) Patent No.: US 7,580,686 B2
(45) Date of Patent: Aug. 25, 2009

(54) ADAPTIVE PREDISTORTION METHOD AND ARRANGEMENT

(75) Inventors: Tony Fonden, Spanga (SE); Lars Richard Birger Hellberg, Huddinge (SE); Mats Klingberg, Enskede (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 459 days.

(21) Appl. No.: 11/569,034

(22) PCT Filed: May 19, 2004

(86) PCT No.: PCT/SE2004/000789

§ 371 (c)(1),
(2), (4) Date: Nov. 13, 2006

(87) PCT Pub. No.: WO2005/112253

PCT Pub. Date: Nov. 24, 2005

(65) Prior Publication Data

US 2007/0182484 A1  Aug. 9, 2007

(51) Int. Cl.
*H04B 1/04* (2006.01)
*H03C 1/62* (2006.01)
*H04K 1/02* (2006.01)

(52) U.S. Cl. ............. 455/114.2; 455/114.3; 455/115.1; 455/126; 375/296

(58) Field of Classification Search ............. 455/114.2, 455/114.3, 115.1, 126; 375/296
See application file for complete search history.

(56) References Cited

U.S. PATENT DOCUMENTS

| 4,291,277 A | * | 9/1981 | Davis et al. .................. 330/149 |
| 5,483,681 A | * | 1/1996 | Bergsten et al. ............. 455/126 |
| 5,870,668 A | * | 2/1999 | Takano et al. ............... 455/126 |
| 5,894,496 A | * | 4/1999 | Jones .......................... 455/126 |
| 7,133,649 B2 | * | 11/2006 | Kanazawa et al. ............ 455/91 |
| 2002/0034260 A1 | | 3/2002 | Kim |
| 2003/0156658 A1 | | 8/2003 | Dartois |
| 2004/0057533 A1 | | 3/2004 | Kermalli |

FOREIGN PATENT DOCUMENTS

| EP | 1199797 A1 | 4/2002 |
| WO | WO 0217586 A1 | 2/2002 |
| WO | WO 03017466 A2 | 2/2003 |
| WO | WO 03019773 A1 | 2/2003 |

OTHER PUBLICATIONS

T.L. Valena, "An Adaptive Predistorter for TDMA Transmitters Using a Heterodyne Architecture", VTC'99 Conference Record (1999).

* cited by examiner

*Primary Examiner*—Duc M Nguyen
(74) *Attorney, Agent, or Firm*—Roger S. Burleigh (57) ABSTRACT

An adaptive predistortion arrangement includes means (26, 40, 42, 44, 46) for up-converting a baseband signal (S1) into an intermediate frequency signal (S12) having frequency aliazing and means (18, 20, 220, 24, 26) for down-converting a radio frequency signal (S4) into an intermediate frequency signal (S7) having the same frequency aliazing as the up-converted baseband signal. An adapter (34) adapts predistortion parameters to keep the up-converted baseband signal equal to the down-converted radio frequency signal.

12 Claims, 9 Drawing Sheets

ADAPTIVE PREDISTORTION METHOD AND ARRANGEMENT

TECHNICAL FIELD

The present invention relates to predistortion in systems where a baseband signal is converted into a radio frequency signal to be transmitted, such as radio frequency power amplifier systems.

BACKGROUND

In many technical systems an output signal has to precisely follow a given input signal. A particular example is a radio-frequency (RF) power amplifier (PA), although the principles and solutions disclosed in this document are generally valid.

For the radio frequency power amplifier it is important that the (complex-valued) output signal envelope is, to within a very strict approximation, proportional to the input signal envelope. This is called a linear power amplifier. Deviations from this ideal situation are called non-linearities. To produce and run an ideal power amplifier that has small enough non-linearities is, in most cases, uneconomical and unpractical. It is often more advantageous to use a linearized power amplifier (LPA) that is composed of the actual power amplifier together with other components that compensate for the non-linearities of the power amplifier.

An often used method for this is predistortion linearization. Here the input to the power amplifier is distorted in such a way that the non-linearities of the actual power amplifier are compensated for. Thus, the output of the linearized power amplifier is proportional to the input of the predistorter. A problem of the predistortion linearization method is that the adjustment of the predistorter to achieve this result is very critical. In particular the characteristics of the power amplifier are generally "drifting" due to temperature variations, aging, moisture, etc. This means that the predistorter has to continuously adjusted to account for these changing characteristics.

The generally accepted solution to this adjustment problem is to use adaptive predistortion linearization. The output of the power amplifier is measured by an observation receiver and compared to the input of the linearized power amplifier. An adapter adjusts the predistorter so that the output signal is indeed proportional to the input signal. A problem with this solution is that the observation receiver is rather complex and costly due to the high bandwidth requirements on the involved components.

SUMMARY

An object of the present invention is an adaptive predistortion method and arrangement that are simpler and thus less costly than the prior art.

This object is achieved in accordance with the attached claims.

Briefly, the present invention solves this problem by allowing frequency aliasing in the down-conversion. However, this aliasing is introduced both in the input signal and the output signal and is cancelled in the adaptation process. This reduces the bandwidth requirements on the on the involved components, which simplifies the design and costs.

BRIEF DESCRIPTION OF THE DRAWINGS

The invention, together with further objects and advantages thereof, may best be understood by making reference to the following description taken together with the accompanying drawings, in which.

DETAILED DESCRIPTION

In the following description the same reference designations will be used for elements having the same or similar functions.

Figure 1:
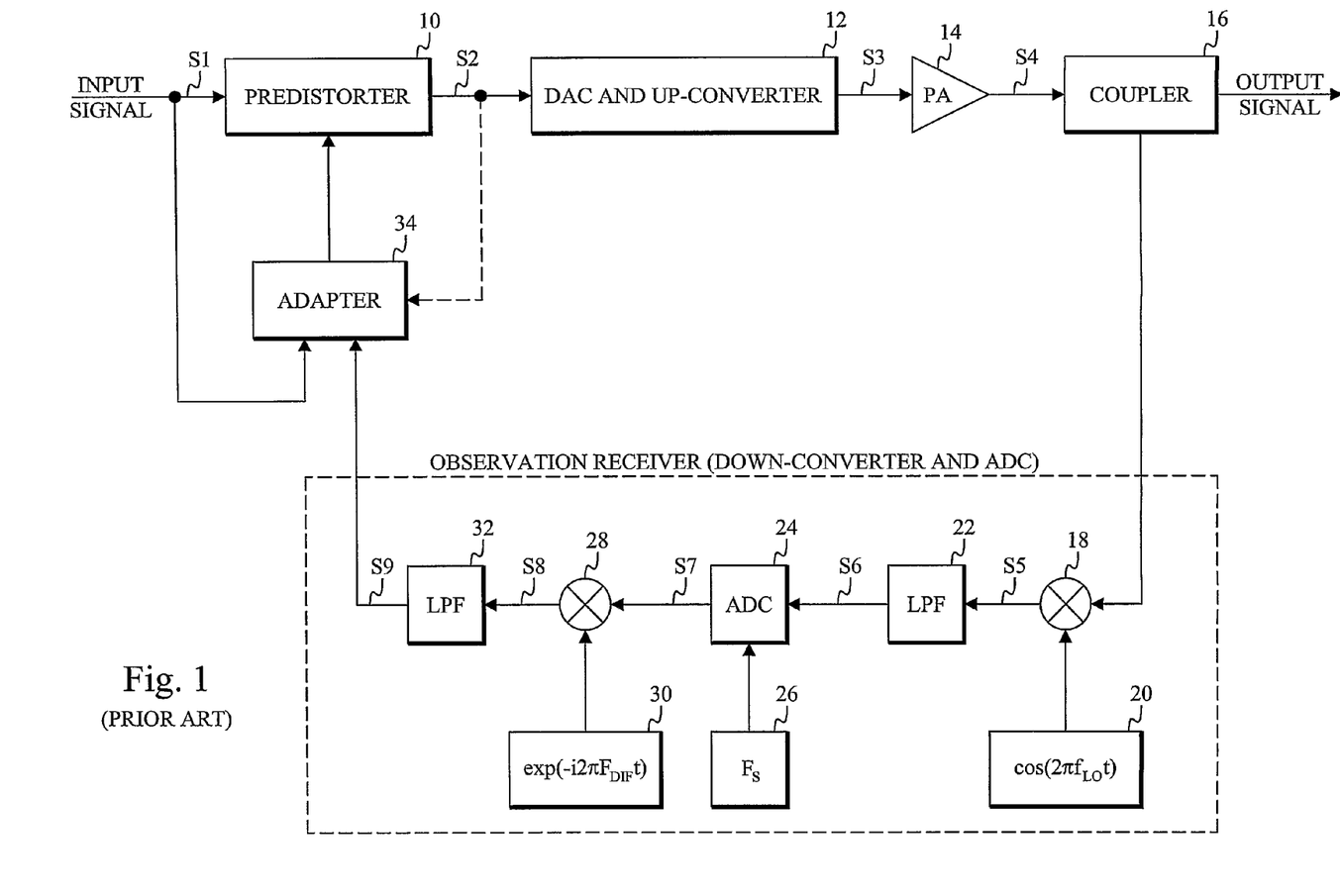
FIG. 1 is a block diagram of a prior art linearized power amplifier.
Figure 2:
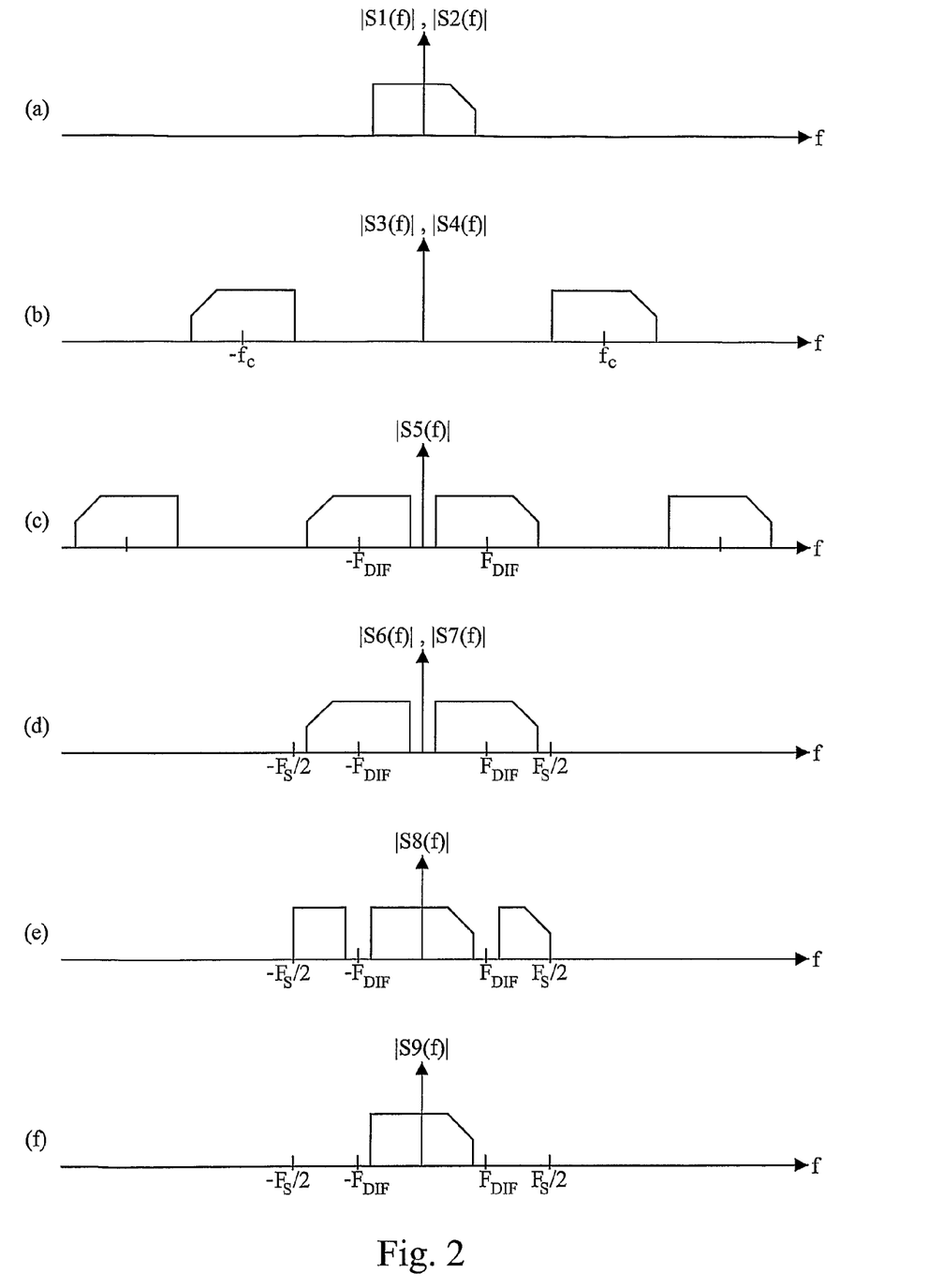
FIG. 2 illustrates the spectra of various signals of the power amplifier of FIG. 1.

FIG. 1 is a block diagram of a prior art linearized power amplifier described in [1]. FIG. 2 illustrates the spectra for various signals of the power amplifier of FIG. 1. A complex baseband signal S1 is forwarded to a predistorter 10, which predistorts the signal to counteract distortion produced by a digital/analog converter and up-converter block 12 and a radio frequency power amplifier 14. The output signal S2 of predistorter 10 is taken up from baseband to the carrier frequency $f_C$ and made real-valued by the up-converter, thereby producing radio frequency signal S3, which is amplified into radio frequency signal S4. It should be noted that the plots in FIG. 2 are sketches of the power spectra only. They are not to scale, and do not include possible non-linearities of predistorter 10, up-converter block 12 or power amplifier 14.

A coupler 16 takes a small part of radio frequency signal S4 from power amplifier 14 to an observation receiver, which essentially performs the opposite operations of up-converter block 12. Signal S4 is forwarded to a mixer 18, in which it is multiplied by $\cos(2\pi f_{LO} t)$ from a local oscillator 20 to produce signal S5. Here $f_{LO}$ is chosen such that $F_{DIF}=f_C-f_{LO}$, where $F_{DIF}$ is an Intermediate frequency. Signal S5 is filtered in a low-pass filter 22, and the resulting intermediate frequency signal S6 is A/D converted in an A/D converter 24 at sampling rate $F_S$ provided by a clock 26. The digital signal S7 is down-converted to a complex baseband signal S8 in a mixer 28 using a complex signal $\exp(-i2\pi F_{DIF} t)$ from an oscillator 30. The resulting signal S8 is filtered in a low-pass filter 32 to form a down-converted complex baseband signal S9. If all components of the system are ideal, then signals S1 and S9 should be identical (up to a proportionality factor and a time-delay of the loop. The proportionality factor is assumed to be unity and will not be considered anymore. The time-delay has to be compensated for by a corresponding time-delay for the signal S1 from the input to the adapter. However, since the handling of such time-delays is well known, and is not needed to explain the present invention, it is not included in the figures). Since signal S9 is typically not equal to signal S1 due to distortion produced in the up-conversion and power amplifier 14, signal S9 is compared to input signal S1 in an adapter 34, the purpose of which is to adjust the parameters of predistorter 10 to make the signals as equal as possible.

Normally the sampling rate $F_S$ and the digital intermediate frequency $F_{DIF}$ are related as $F_S=4F_{DIF}$, as described in [1]. However, lower sampling rates have also been suggested, see [2]. Lowering sampling rates is also described in [3]. However, in this case the entire signal processing is performed at baseband.

Although the signals S1 and S9 are the only absolutely needed input signals to adapter 34, a faster or more efficient adaptation of the predistorter parameters can sometimes be achieved by also using the output signal S2 of the predistorter.

A problem with this prior art predistorter arrangement is that the intermediate frequency $F_{DIF}$ has to be at least half the bandwidth W of baseband signal S1. Otherwise the signal is distorted by overlap of the (originally) negative and positive frequency images of the signal spectrum, thereby producing "folding distortion" or frequency aliazing. This means that the lowest allowed frequency for the lowest frequency component of the positive frequency image of signal S5 is zero. Thus, the required analog bandwidth of A/D converter 24 is at least equal to the bandwidth W of baseband signal S1.

It would desirable to relax the requirements on the A/D converter. However, since the linearization of the power amplifier in practice is achieved by adjusting adapter 34 to make the signals S1, S9 at its two inputs equal, the observation receiver should ideally just cancel the effect of the up-converter. Relaxing the frequency requirements on the A/D converter would also introduces "folding distortion" or frequency aliazing, which means that the two inputs to the adapter would not be equal even for perfect linearity of the cascade of predistorter and power amplifier. Thus, the predistorter would not be correctly adapted.

The solution is to introduce the equivalent "folding distortion" or frequency aliazing also in the path from the linearized power amplifier input S1 to the corresponding adapter input. Then equality of the two input signals of the adapter will indeed be equivalent to linearity of the cascade of predistorter and power amplifier also in the presence of frequency aliazing, since this aliazing is the same for the two adapter input signals.

Figure 3:
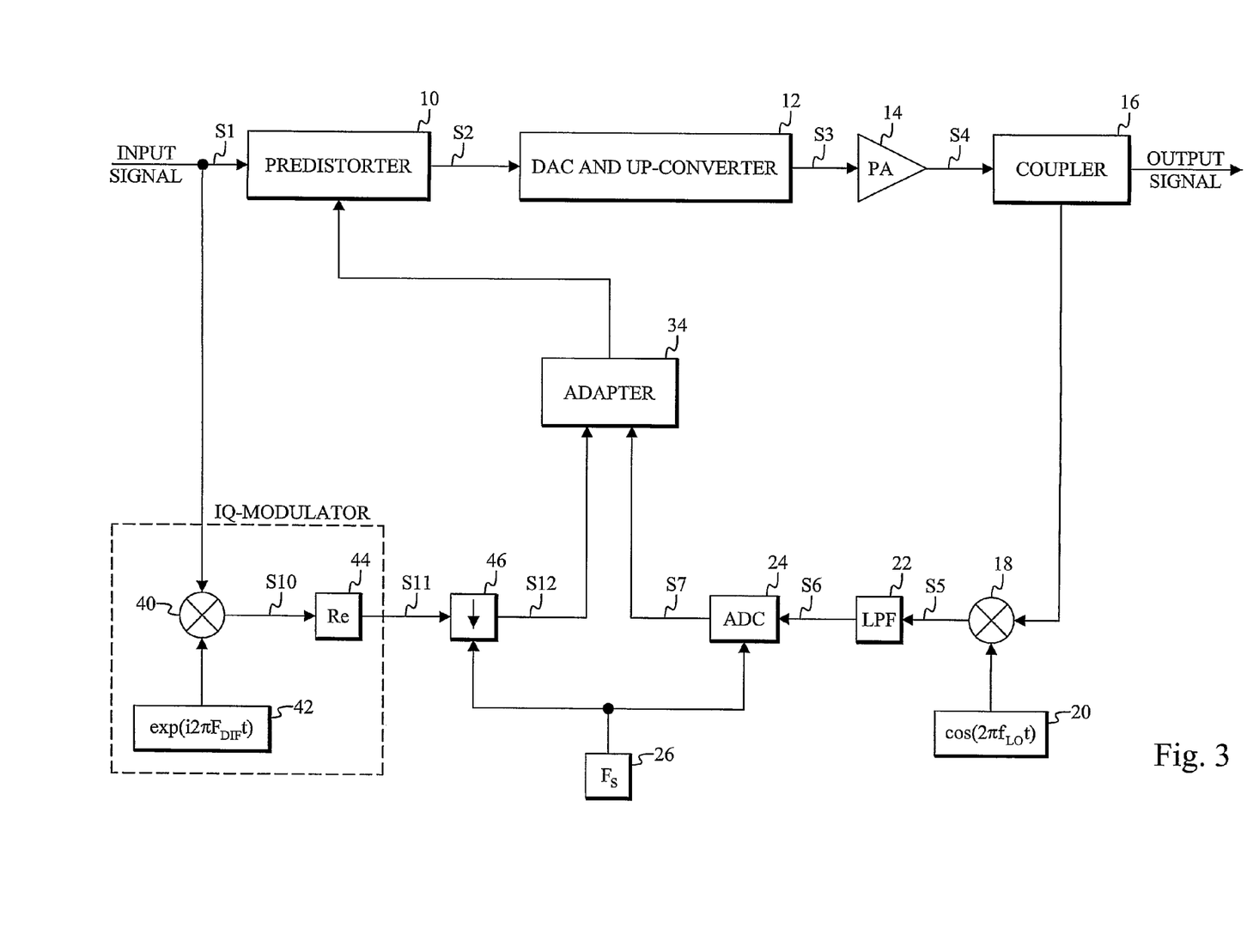
FIG. 3 is a block diagram of a linearized power amplifier provided with a first exemplary embodiment of an adaptive predistortion arrangement in accordance with the present invention.

FIG. 3 is a block diagram of a linearized power amplifier provided with a first exemplary embodiment of an adaptive predistortion arrangement in accordance with the present invention. Elements 18, 20, 22, 24 and 26 perform the same functions as in the prior art embodiment of FIG. 1. However, according to the present invention the final down-conversion to baseband in the prior art embodiment is not performed. Instead intermediate frequency signal S7 is forwarded to adapter 34. Instead of performing the final down-conversion from intermediate frequency to baseband, the present invention performs an up-conversion of baseband signal S1 to intermediate frequency. This is accomplished by an IQ-modulator including a complex mixer 40, a complex oscillator 42 and a real value extractor 44 followed by a down-sampler 46 (alternatively the order of the IQ-modulator and down-sampler 46 may be reversed). By using the same rate $F_S$ for A/D converter 24 and down-sampler 46, the up-converted signal S12 will have the same frequency as the down-converted signal S7 (In an embodiment where output signal S11 from the IQ-modulator already has the desired sampling rate, down-converter 46 may be eliminated.). These two signals are forwarded to adapter 34.

Figure 4:
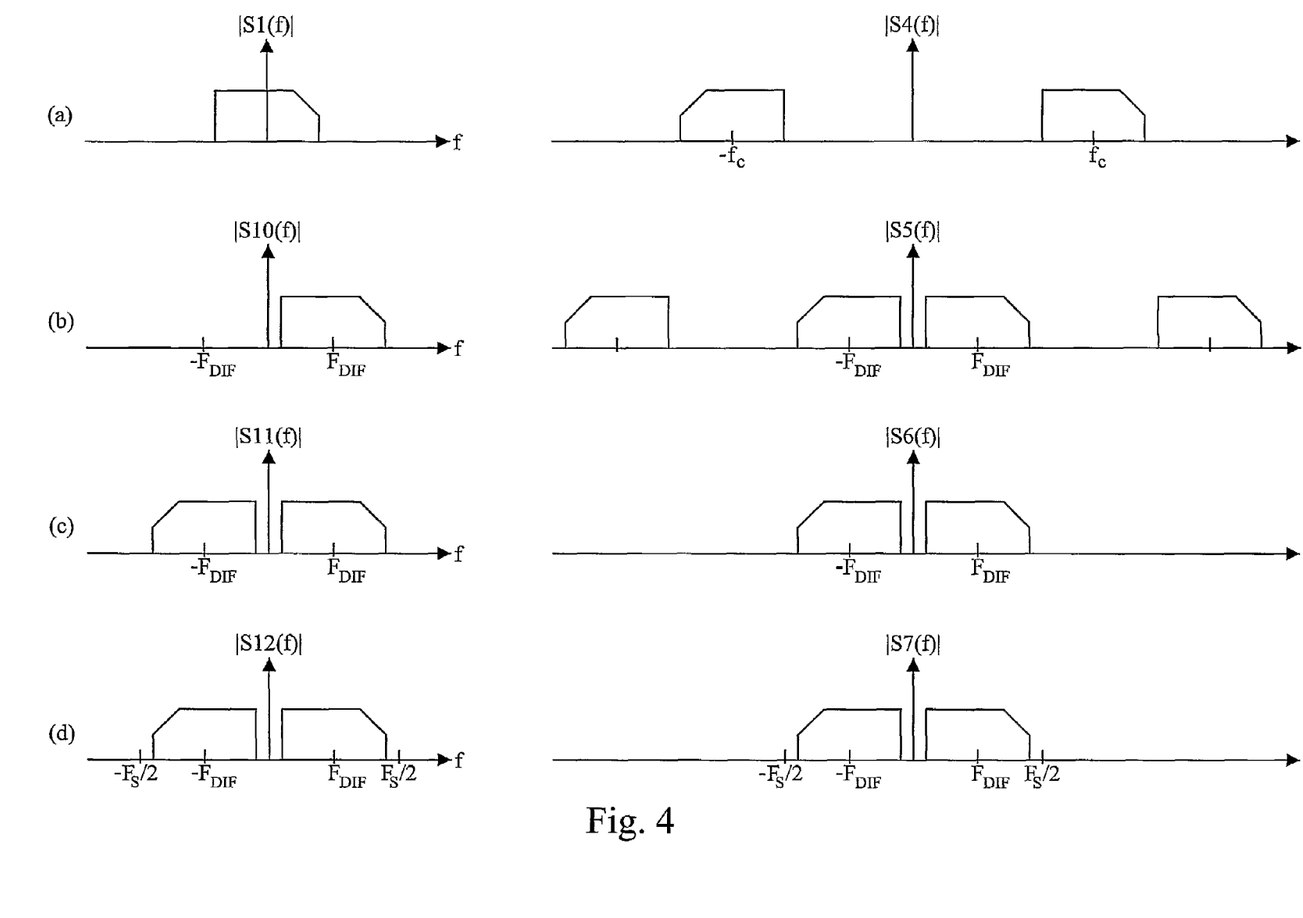
FIG. 4 illustrates the spectra of various signals of the power amplifier of FIG. 3 when there is no frequency aliasing.

FIG. 4 illustrates the spectra of various signals of the power amplifier of FIG. 3 when there is no frequency aliazing. The left part of the figure illustrates the up-conversion of baseband signal S1 and the right part of the figure illustrates the down-conversion of radio frequency signal S4. As can be seen in FIG. 4(d), signals S12 and S7 have the same spectrum (as in FIG. 2 ideal components are assumed).

Figure 5:
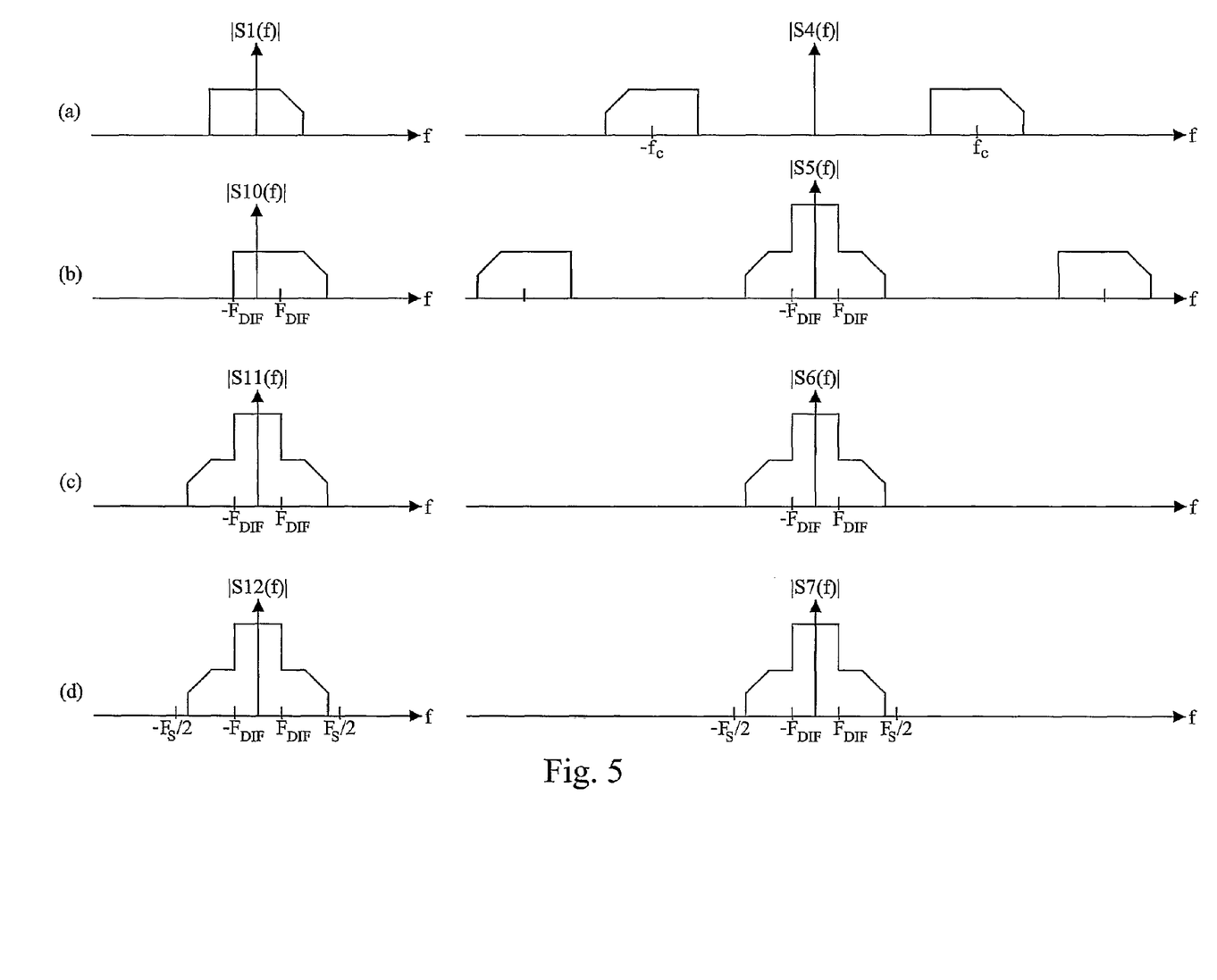
FIG. 5 illustrates the spectra of various signals of the power amplifier of FIG. 3 when the digital intermediate frequency $F_{DIF}$ has been reduced to produce frequency aliasing.

FIG. 5 illustrates the spectra of various signals of the power amplifier of FIG. 3 when the digital intermediate frequency $F_{DIF}$ has been reduced to produce frequency aliazing. In this case signal S7 will include frequency aliazing, as illustrated by the peak in the middle of the spectrum. However, signal S12 will include exactly the same aliazing. Since both signals are distorted in the same way by aliazing, the aliazing effect is cancelled in adapter 34. This means that intermediate frequency $F_{DIF}$ may be selected lower than in the prior art, in which this frequency aliazing has to be avoided. In fact intermediate frequency $F_{DIF}$ may have an arbitrarily low value. This means that the required analog bandwidth of A/D converter 24 is only half of that required in prior art (If $F_{DIF}=0$, the required analog bandwidth is only W/2, whereas if $F_{DIF}=W/2$, as in the prior art, the required analog bandwidth is W).

Figure 6:
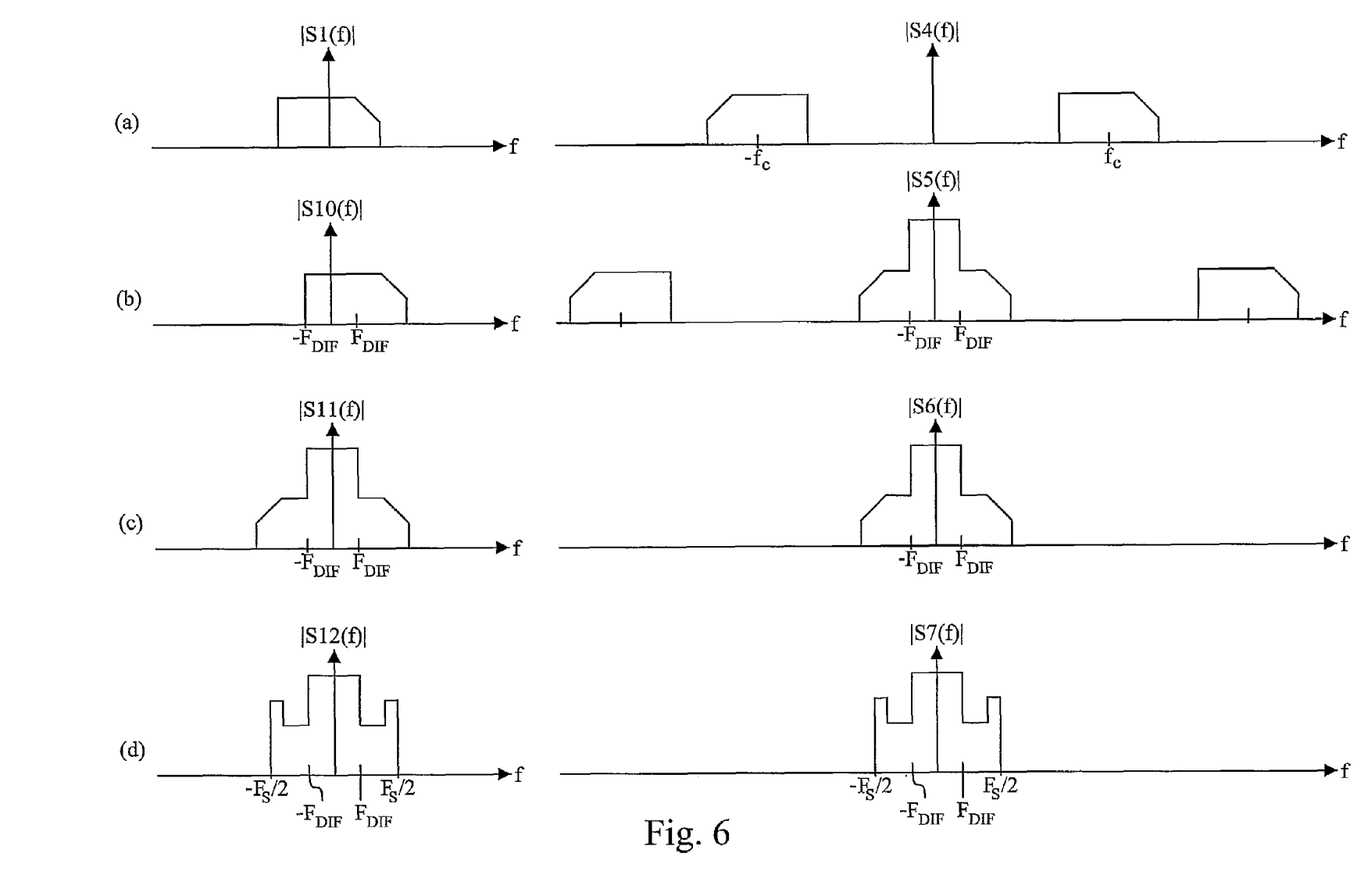
FIG. 6 illustrates the spectra of various signals of the power amplifier of FIG. 3 when the digital intermediate frequency $F_{DIF}$ as well as the sampling rate $F_S$ have been reduced to produce frequency aliasing.

It is also possible to perform under-sampling of signals S6 and S11. Again, this under-sampling produces frequency aliazing, but since this aliazing is the same in signals S12 and S7, the aliazing effect is cancelled in adapter 34. This situation is illustrated by the spectra in FIG. 6. In addition to the frequency aliazing at the middle of the spectra due to a low frequency $F_{DIF}$, there is further frequency aliazing at the edge of the spectra due to the under-sampling by a low sampling rate $F_S$. This sampling rate may be arbitrarily low.

The first embodiment of the invention should work well, at least if a very fast and efficient adaptation is not required. A potential problem with the first embodiment is that there could be difficulties for the adapter to predict in what direction the output of the power amplifier would go for a given change of the predistorter parameters. The adapter could of course solve this by more or less developed strategies for taking small "trial steps" in the predistorter parameter space, and then simply observe the resulting change in the difference between the two adapter input signals. Although this would work, it would in many cases be better and more efficient if the adapter could know a priori how a particular change of parameters would affect the output of the power amplifier (and thus the error signal).

Figure 7:
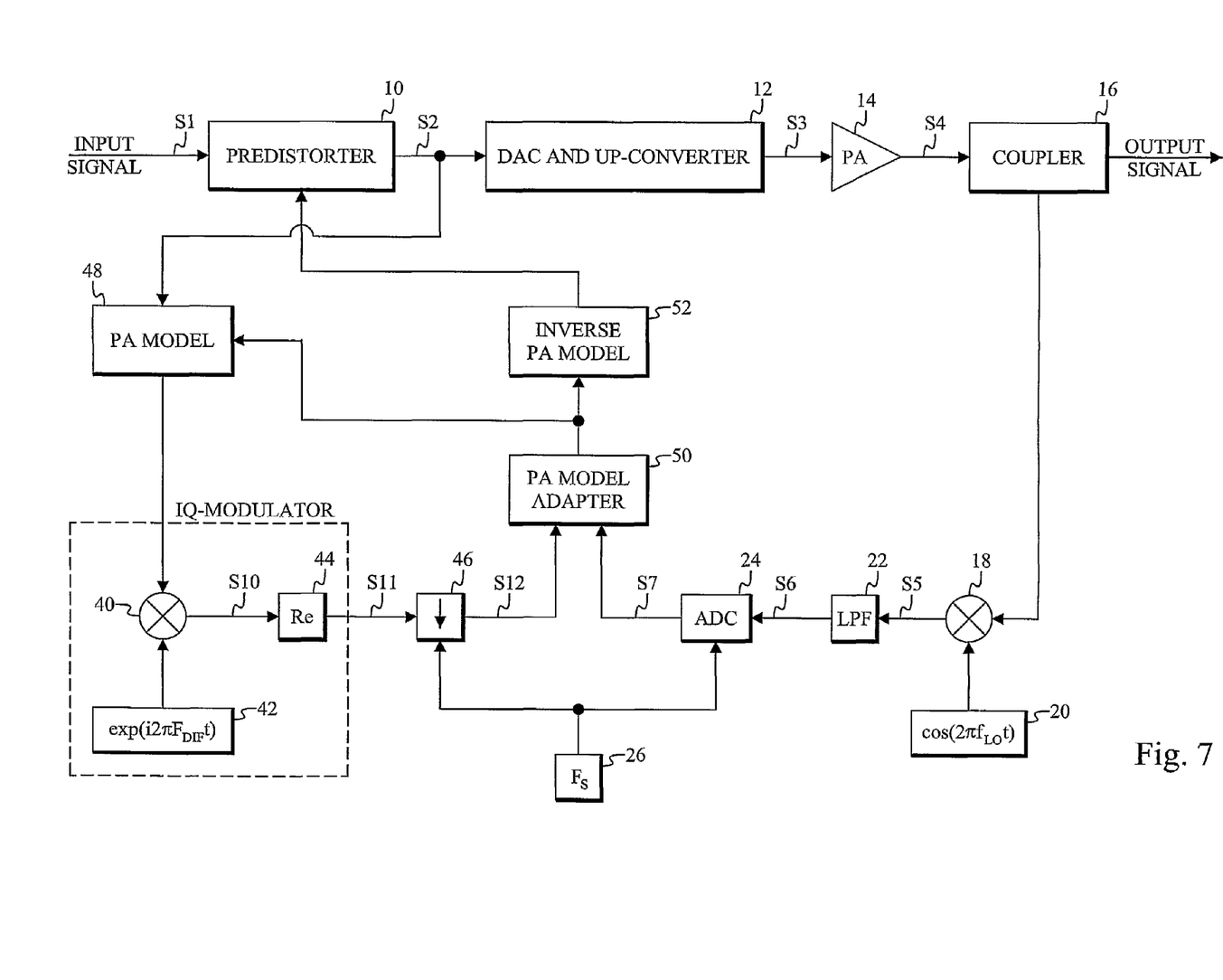
FIG. 7 is a block diagram of a linearized power amplifier provided with a second exemplary embodiment of an adaptive predistortion arrangement in accordance with the present invention.

FIG. 7 shows an embodiment based on this idea. Instead of directly adapting the parameters of the predistorter, a model 48 of the power amplifier (Actually a model of the power amplifier and possible non-idealities of the DAC and up-converter. So in this as well as the other embodiments of the invention also certain non-idealities of the up-converter will be compensated for by the predistorter.) is fitted to as accurately as possibly represent the signal processing of the actual power amplifier 14. Although the actual power amplifier 14 is operating at analog RF, the model 48 is, in this embodiment of the invention, operating at the equivalent digital complex baseband. Other embodiments with a power amplifier model operating, e.g., at RF are also feasible. The power amplifier model adapter 50 of the power amplifier in FIG. 7 has an easier task than the predistorter adapter 34 in FIG. 3. The reason for this is that power amplifier model adapter 50 in FIG. 7 knows a priori what power amplifier model is implemented. Thus, it knows a priori how a given change of the power amplifier model parameters will change the power amplifier model signal output. Mathematically this can be expressed (e.g.) as that the power amplifier model adapter 50 has a priori knowledge of the partial derivatives of the power amplifier model output signal samples with respect to the power amplifier model parameters. A lot of well known mathematical techniques then exist for taking this knowledge into account to perform an efficient adaptation. In this second embodiment of the present invention an inverse power amplifier model 52 is inserted between power amplifier model adapter 50 and predistorter 10.

Figure 8:
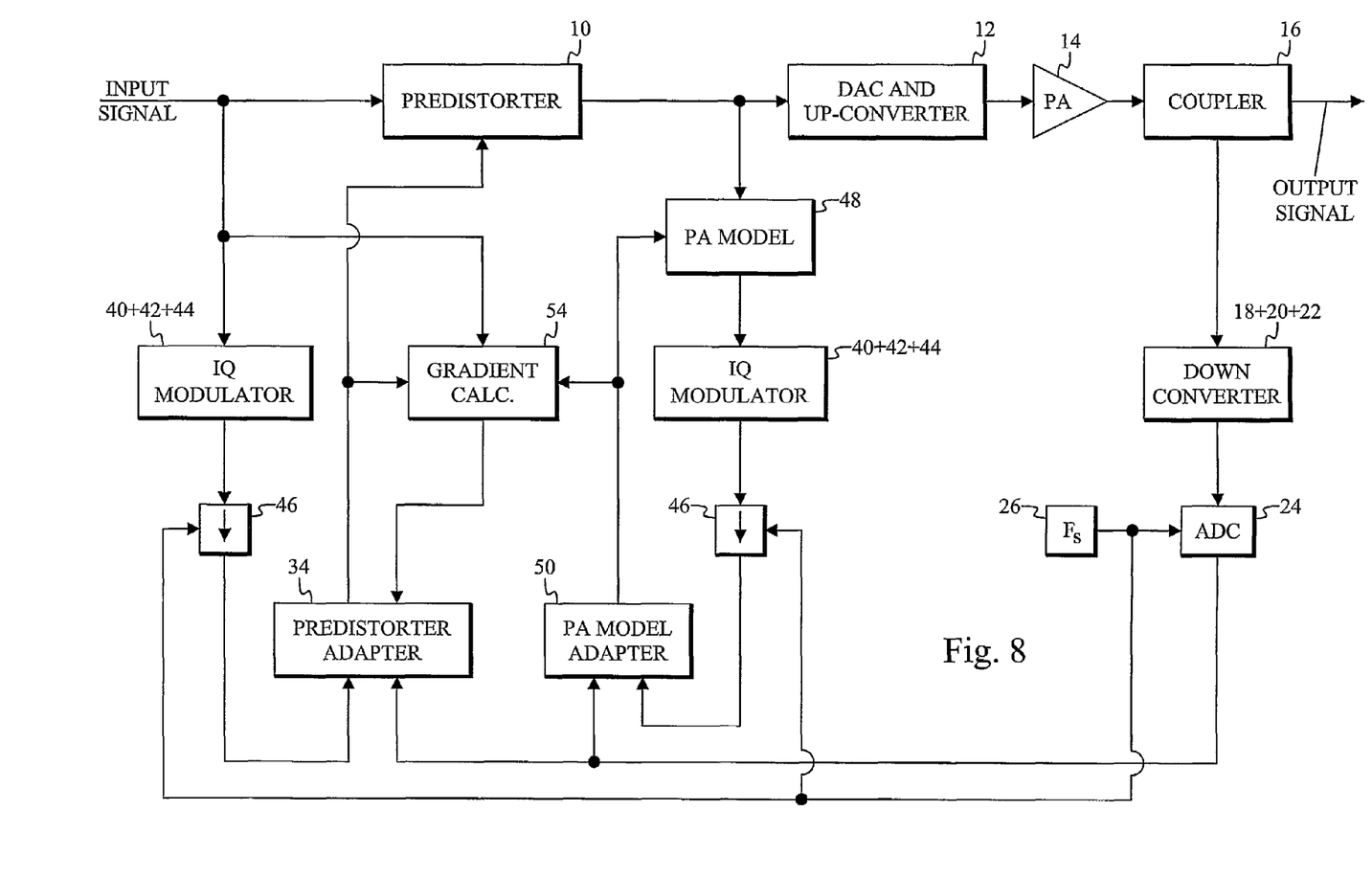
FIG. 8 is a block diagram of a linearized power amplifier provided with a third exemplary embodiment of an adaptive predistortion arrangement in accordance with the present invention.

A potential problem with the second embodiment of the invention is that the predistorter is "open loop". I.e., the error signal "output from power amplifier minus input to the predistorter" is never explicitly observed. This makes the resulting linearity of the second embodiment sensitive to the quality of the power amplifier model. Should this turn out to be a problem, one could instead use the embodiment shown in FIG. 8. Also in this embodiment a power amplifier model 48 is fitted to the observed data using a power amplifier model adapter 50. The predistorter 10 is, however, not taken directly from the power amplifier model. Rather the predistorter is adapted "closed loop" in a predistorter adapter 34 to minimize the true error signal, just as in the first embodiment. But the fitted power amplifier model 48 is used to provide the predistorter a reasonable a priori estimate of how the power amplifier output signal would change for a given change of the predistorter model parameters. This a priori estimate can be obtained in the following way: The partial derivatives (gradient) of the predistorter signal output with respect to the predistorter parameter values are known a priori. An estimate of the partial derivatives of the power amplifier output signal with respect to the power amplifier input signal is obtained from the power amplifier model in a gradient calculator 54. An estimate of the partial derivatives of the power amplifier output with respect to the predistorter parameter values is then computed from the chain rule for derivatives. It is noted that in this embodiment the baseband signals both before and after the predistorter are processed in the same way to compensate for the frequency aliazing of the down-converter.

The described predistorter arrangement may be implemented as an FPGA (Field Programmable Gate Array) or an ASIC (Application Specific Integrated Circuit). Another possibility is to use a microprocessor or a micro/signal processor combination and corresponding software. Combinations of these approaches are also possible.

Figure 9:
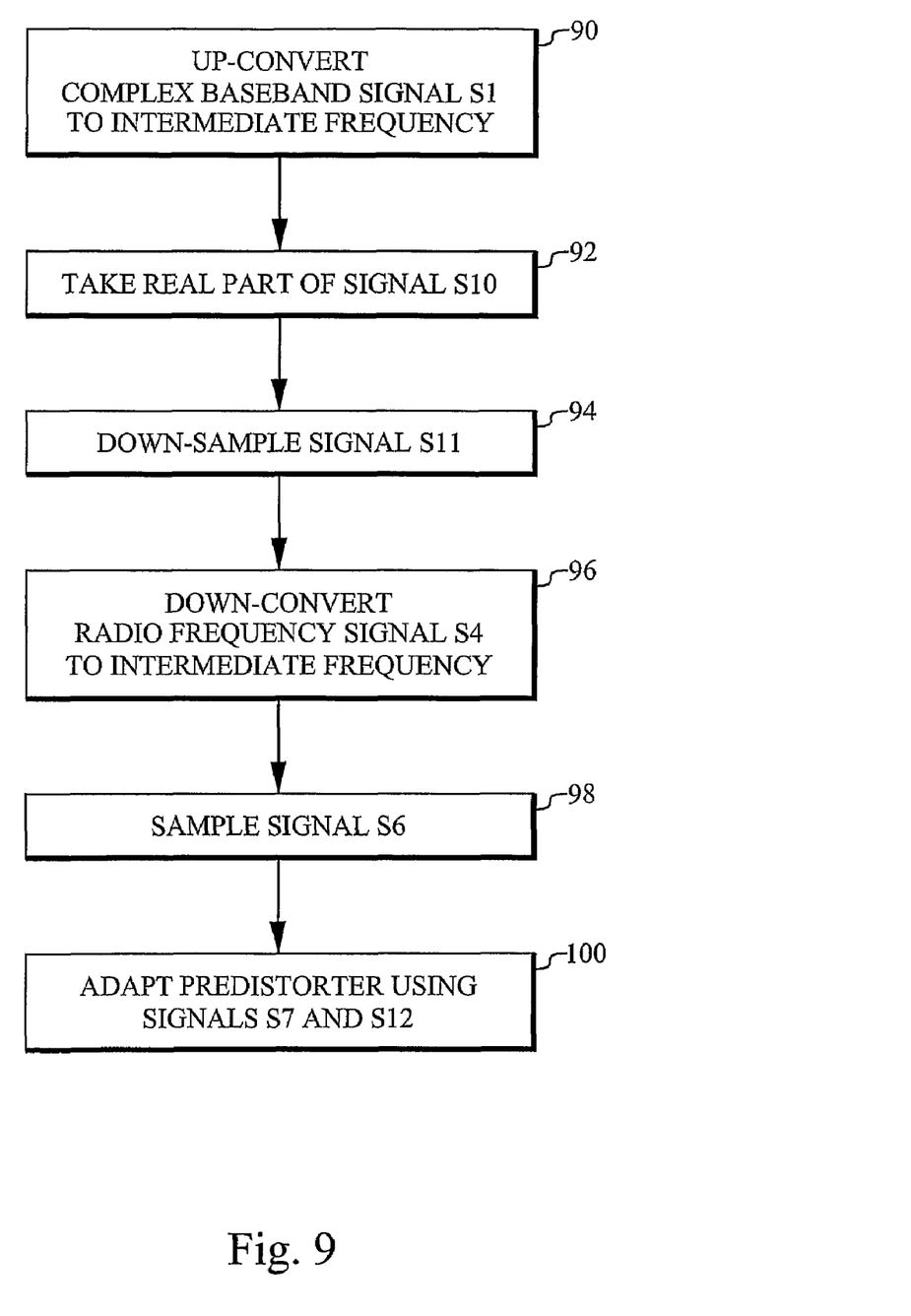
FIG. 9 is a simple flow chart illustrating an exemplary embodiment of the method in accordance with the present invention.

FIG. 9 is a simple flow chart illustrating an exemplary embodiment of the method in accordance with the present invention. This embodiment corresponds to the block diagram in FIG. 3. Step 90 up-converts complex baseband signal S1 to intermediate frequency. Step 92 takes the real part of the up-converted signal S10. Step 94 down-samples signal S11. Step 96 down-converts analog radio frequency signal S4 to intermediate frequency. Step 98 samples the down-converted signal S6. Step 100 adapts the parameters of the predistorter using the resulting signals S7 and S12. It is to be noted that although step sequence 96, 98 follows after step sequence 90, 92, 94 in the flow chart (due to the limitations of a flow chart representation), in reality these step sequences are performed simultaneously.

Instead of applying the described procedures and algorithms to pre-distortion, the same procedures and algorithms can be used for linearization of a nonlinear measurement device from a known input signal. By doing post-processing of data from an ADC (Analog to Digital Converter) using the same algorithms, a linearized response from the ADC can be achieved for enhanced signal measurement purposes.

It will be understood by those skilled in the art that various modifications and changes may be made to the present invention without departure from the scope thereof, which is defined by the appended claims.

REFERENCES

[1] T. L. Valena, "An Adaptive Predistorter for TDMA Transmitters Using a Heterodyne Architecture", VTC'99 Conference Record (1999).

[2] US 2003/0156658 A1, L. Dartois.

[3] EP 1 199 797 A1, TELEFONAKTIEBOLAGET LM ERICSSON

The invention claimed is:

1. An adaptive predistortion method, in which a predistorted baseband signal is converted into a radio frequency signal to be transmitted, characterized by up-converting said baseband signal into an intermediate frequency signal having frequency aliazing;

down-converting said radio frequency signal into an intermediate frequency signal having the same frequency aliazing as said up-converted baseband signal; and adapting predistortion parameters to keep said up-converted baseband signal equal to said down-converted radio frequency signal.

2. The method of claim 1, characterized by down-converting an analog radio frequency signal into an intermediate frequency signal sampled at a predetermined sampling rate.

3. The method of claim 2, characterized by up-converting a complex digital baseband signal into a real intermediate frequency signal sampled at said sampling rate.

4. The method of claim 3, characterized by under-sampling said up-converted and down-converted intermediate frequency signals by selecting said sampling rate to produce frequency aliazing.

5. The method of claim 2, characterized by passing a digital complex baseband signal through a predistorter and a power amplifier model for forming a reference signal;

up-converting said reference signal into a real intermediate frequency signal sampled at said sampling rate.

6. The method of claim 2, characterized by selecting said intermediate frequency lower than half the bandwidth of said baseband signal.

7. An adaptive predistortion arrangement, in which a predistorted baseband signal is converted into a radio frequency signal to be transmitted, characterized by means for up-converting said baseband signal into an intermediate frequency signal having frequency aliazing;

means for down-converting said radio frequency signal into an intermediate frequency signal having the same frequency aliazing as said up-converted baseband signal; and an adapter for adapting predistortion parameters to keep said up-converted baseband signal equal to said down-converted radio frequency signal.

8. The arrangement of claim 7, characterized by means for down-converting an analog radio frequency signal into an intermediate frequency signal sampled at a predetermined sampling rate.

9. The arrangement of claim 8, characterized by means for up-converting a complex digital baseband signal into a real intermediate frequency signal sampled at said sampling rate.

10. The arrangement of claim 9, characterized by means for setting said intermediate frequency lower than half the bandwidth of said baseband signal.

11. The arrangement of claim 9, characterized by means for under-sampling said up-converted and down-converted intermediate frequency signals by setting said sampling rate to produce frequency aliazing.

12. The arrangement of claim 8, characterized by means for passing a digital complex baseband signal through a predistorter and a power amplifier model for forming a reference signal;

means for up-converting said reference signal into a real intermediate frequency signal sampled at said sampling rate.

* * * * *

UNITED STATES PATENT AND TRADEMARK OFFICE
CERTIFICATE OF CORRECTION

PATENT NO.        : 7,580,686 B2
APPLICATION NO. : 11/569034
DATED             : August 25, 2009
INVENTOR(S)       : Fonden et al.

It is certified that error appears in the above-identified patent and that said Letters Patent is hereby corrected as shown below:

On the Title Page, item (57), under "ABSTRACT", in Column 2, Line 4, delete "220," and insert -- 22, --, therefor.

In Column 3, Line 65, delete "512" and insert -- S12 --, therefor.

In Column 4, Lines 20-25, delete "$F_{DIF}$ may have . . . . is W)." and insert the same in line 20, after "frequency" as a continuation.

Signed and Sealed this

Twenty-fourth Day of November, 2009

David J. Kappos
*Director of the United States Patent and Trademark Office*